(12) United States Patent
Chen et al.

(10) Patent No.: US 9,805,806 B2
(45) Date of Patent: Oct. 31, 2017

(54) NON-VOLATILE MEMORY CELL AND METHOD OF OPERATING THE SAME

(71) Applicant: eMemory Technology Inc., Hsin-Chu (TW)

(72) Inventors: Hsueh-Wei Chen, Hsinchu (TW); Wei-Ren Chen, Pingtung County (TW); Wein-Town Sun, Taoyuan (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/275,454

(22) Filed: Sep. 25, 2016

(65) Prior Publication Data

US 2017/0110195 A1   Apr. 20, 2017

Related U.S. Application Data

(60) Provisional application No. 62/242,310, filed on Oct. 16, 2015.

(51) Int. Cl.
| | |
|---|---|
| *G11C 16/04* | (2006.01) |
| *G11C 16/14* | (2006.01) |
| *H01L 29/423* | (2006.01) |
| *H01L 29/45* | (2006.01) |
| *H01L 29/78* | (2006.01) |
| *H01L 29/788* | (2006.01) |

(52) U.S. Cl.
CPC ........ *G11C 16/14* (2013.01); *H01L 29/42328* (2013.01); *H01L 29/452* (2013.01); *H01L 29/7834* (2013.01); *H01L 29/7881* (2013.01); *H01L 29/7885* (2013.01)

(58) Field of Classification Search
CPC ..... G11C 16/0483; G11C 16/14; G11C 16/26; G11C 16/0408; G11C 16/0425; G11C 16/30; G11C 16/06; G11C 16/08; G11C 16/04; G11C 2216/04; G11C 11/404; G11C 11/565; G11C 14/0018; G11C 16/0416
USPC ............ 365/185.17, 185.18, 185.29, 185.01, 365/185.28, 63, 149, 185.03, 185.05, 365/185.2, 185.26, 185.33, 185.11, 365/185.14; 257/E27.103, 314, 315, 257/E21.69, E21.679, E29.3, 326, 316, 257/321, E29.129, E21.682, E21.209, 257/E21.422, E21.689, E27.081
See application file for complete search history.

(56) References Cited

U.S. PATENT DOCUMENTS

| | | |
|---|---|---|
| 7,440,311 B2 | 10/2008 | Terzioglu |
| 7,889,553 B2 | 2/2011 | Terzioglu |
| 8,344,443 B2 | 1/2013 | Chen |
| 8,592,886 B2 | 11/2013 | Hsu |

(Continued)

*Primary Examiner* — Thong Q Le
(74) *Attorney, Agent, or Firm* — Winston Hsu

(57) ABSTRACT

A non-volatile memory cell includes a substrate, a select gate, a floating gate, and an assistant control gate. The substrate includes a first diffusion region, a second diffusion region, a third diffusion region, and a fourth diffusion region. The select gate is formed above the first diffusion region and the second diffusion region in a polysilicon layer. The floating gate is formed above the second diffusion region, the third diffusion region and the fourth diffusion region in the polysilicon layer. The assistant control gate is formed above the floating gate in a metal layer, wherein an area of the assistant control gate overlaps with at least half an area of the floating gate.

14 Claims, 4 Drawing Sheets

(56) References Cited

U.S. PATENT DOCUMENTS

2007/0221982 A1* 9/2007 Ikeda .................... H01L 27/115
  257/314
2015/0001608 A1* 1/2015 Tan ................... H01L 29/42324
  257/321

* cited by examiner

NON-VOLATILE MEMORY CELL AND METHOD OF OPERATING THE SAME

CROSS REFERENCE TO RELATED APPLICATIONS

This application claims the benefit of U.S. provisional application No. 62/242,310, filed Oct. 16, 2015.

BACKGROUND OF THE INVENTION

1. Field of the Invention

The present invention is related to a non-volatile memory cell and a method of operating the same, and more particularly, to a non-volatile memory cell with high program/erase efficiency and a method of programming/erasing the same.

2. Description of the Prior Art

Non-volatile memory (NVM) is a type of memory that retains information it stores even when no power is supplied to memory blocks. Some examples include magnetic devices, optical discs, flash memory, and other semiconductor-based memory topologies. Non-volatile memory can be categorized in electrically addressed systems (i.e., read-only memory) and mechanically addressed systems (i.e., hard disks, optical disc, magnetic tape, holographic memory, and such). Specifically, since non-volatile memory does not require its memory data to be periodically refreshed, it is commonly used for secondary storage or long-term consistent storage.

An NVM device includes a memory array having a plurality of memory cells. Each non-volatile memory cell typically utilizes a floating gate positioned above and insulated from a channel region in a semiconductor substrate. The floating gate is positioned between the source and drain regions. A control gate is then provided over the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate. Some non-volatile memory cells have a storage element implemented with the floating gate for storing two ranges of charges. That is, a non-volatile memory cell may be programmed or erased between two states: an erased state and a programmed state.

Generally, with advancement of techniques, a high density or high capacity-based non-volatile memory device is required to facilitate big data accessibility. Thus, a voltage circuit with large size for driving the non-volatile memory cells to operate in erased state and programmed state is essential. However, a voltage circuit capable of supplying high voltage for programming/erasing non-volatile memory cells occupies large space and may not be able to be placed at optimal locations on the chip, thereby decreasing cell density and reducing flexibility or performance of design.

Therefore, there is a need for a non-volatile memory cell which can be programmed and erased with high efficiency without reducing cell density.

SUMMARY OF THE INVENTION

The present invention provides a non-volatile memory cell which includes a substrate, a select gate, a floating gate, and an assistant control gate. The substrate includes a first diffusion region, a second diffusion region, a third diffusion region, and a fourth diffusion region. The select gate is formed above the first diffusion region and the second diffusion region in a polysilicon layer. The floating gate is formed above the second diffusion region, the third diffusion region and the fourth diffusion region in the polysilicon layer. The assistant control gate is formed above the floating gate in a metal layer, wherein an area of the assistant control gate overlaps with at least half an area of the floating gate.

The present invention also provides a method of operating a non-volatile memory cell which includes a substrate, a select gate, a floating gate, and an assistant control gate. The substrate includes a first diffusion region, a second diffusion region, a third diffusion region, and a fourth diffusion region. The select gate is formed above the first diffusion region and the second diffusion region in a polysilicon layer. The floating gate is formed above the second diffusion region, the third diffusion region and the fourth diffusion region in the polysilicon layer. The assistant control gate is formed above the floating gate in a metal layer, wherein an area of the assistant control gate overlaps with at least half an area of the floating gate. The method includes applying a first voltage to the fourth diffusion region and applying a second voltage to the assistant control gate so as to brings electrons onto the floating gate during a program mode of operation, applying a third voltage to the fourth diffusion region and applying a fourth voltage to the assistant control gate as to drag electrons out of the floating gate during an erase mode of operation, wherein the first voltage and the second voltage are between 0 and a first positive value; and the third voltage and the fourth voltage are between 0 and a first negative value.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a single-poly two-transistor-two-capacitor (2T2C) non-volatile memory cell with improved program/erase efficiency and compatible with conventional complementary metal-oxide-semiconductor (CMOS) technology.

Figure 1:
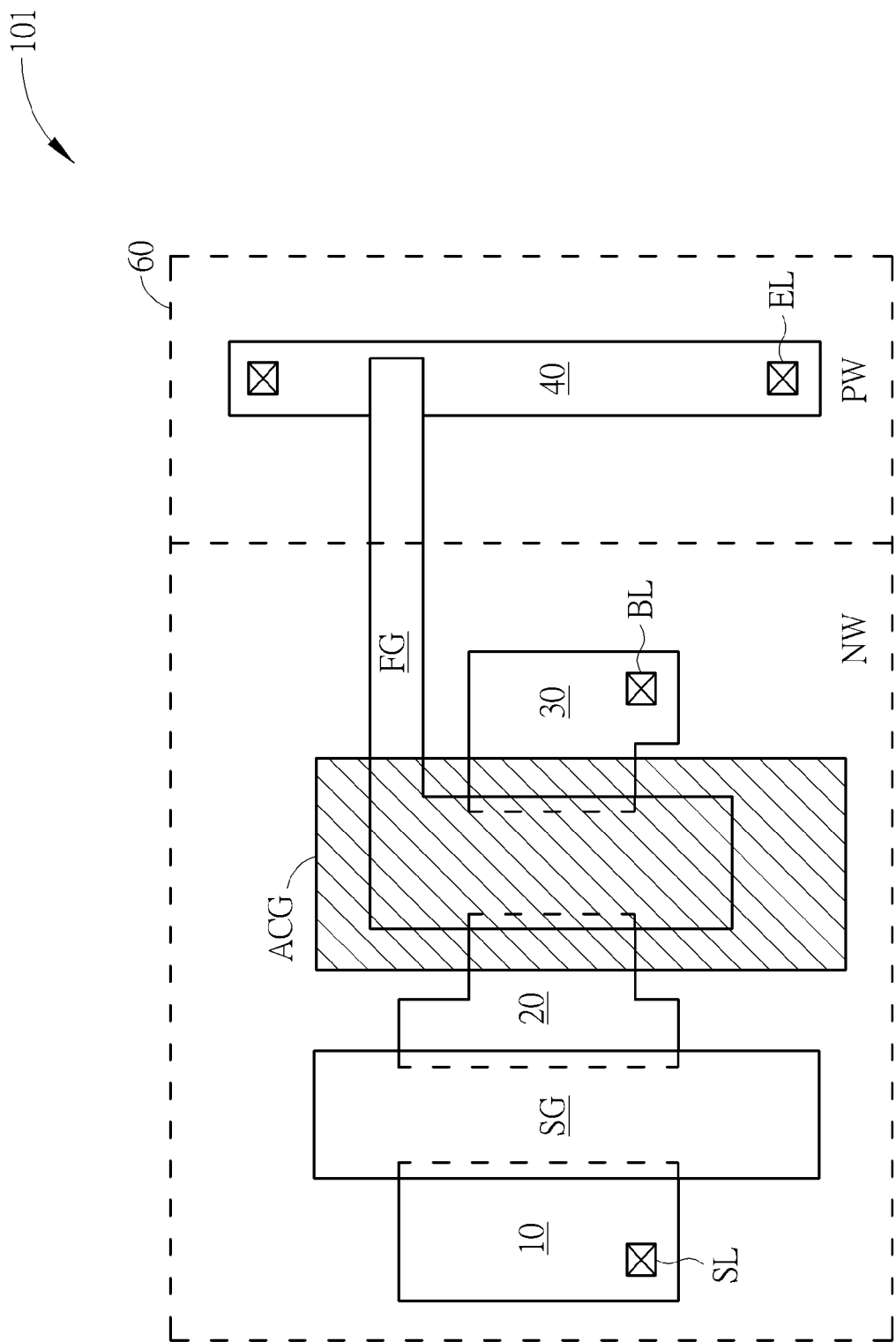
FIG. 1 is a diagram illustrating the top-view of a non-volatile memory cell according to an embodiment of the present invention.
Figure 2:
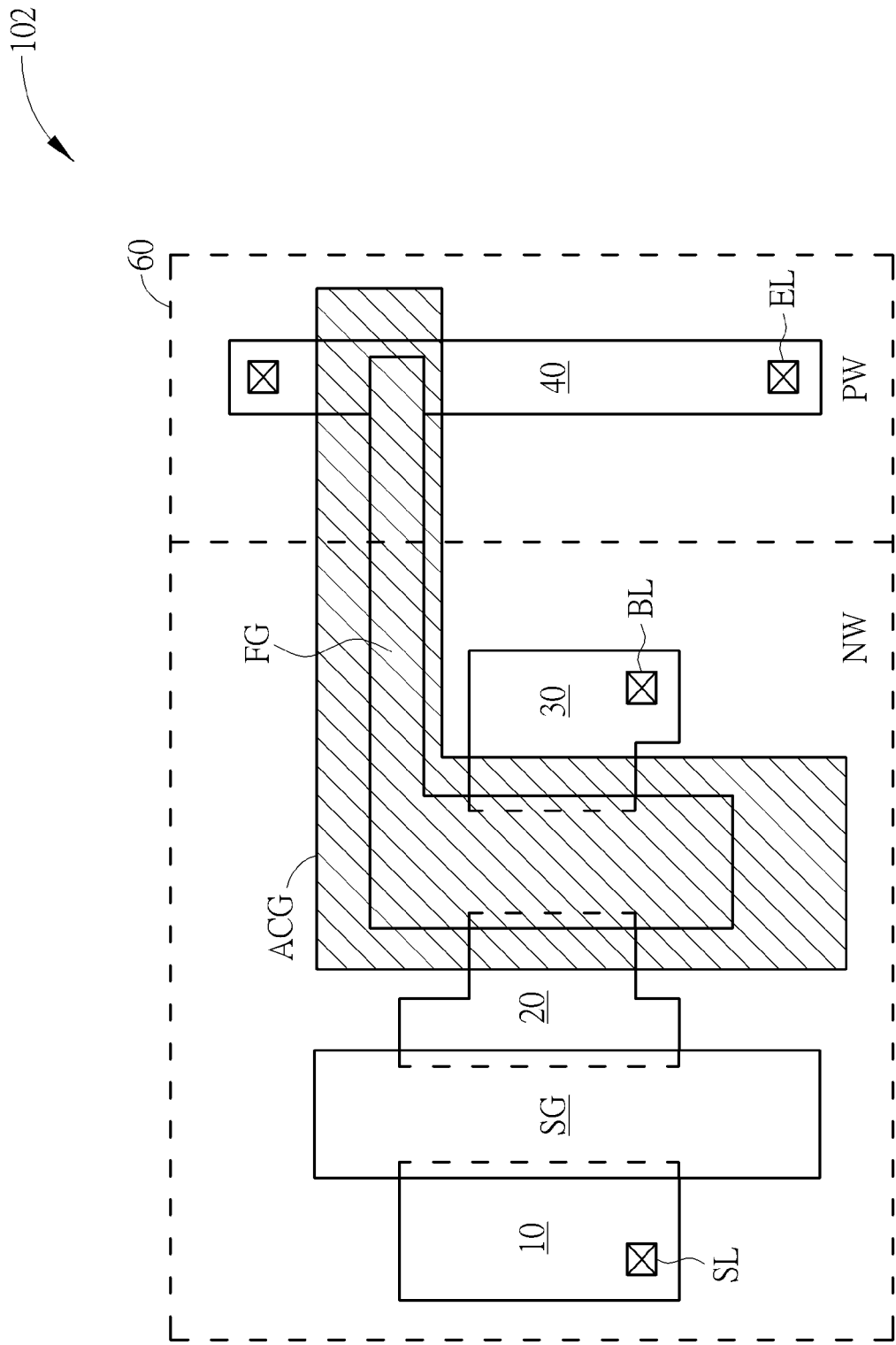
FIG. 2 is a diagram illustrating the top-view of a non-volatile memory cell according to another embodiment of the present invention.
Figure 3:
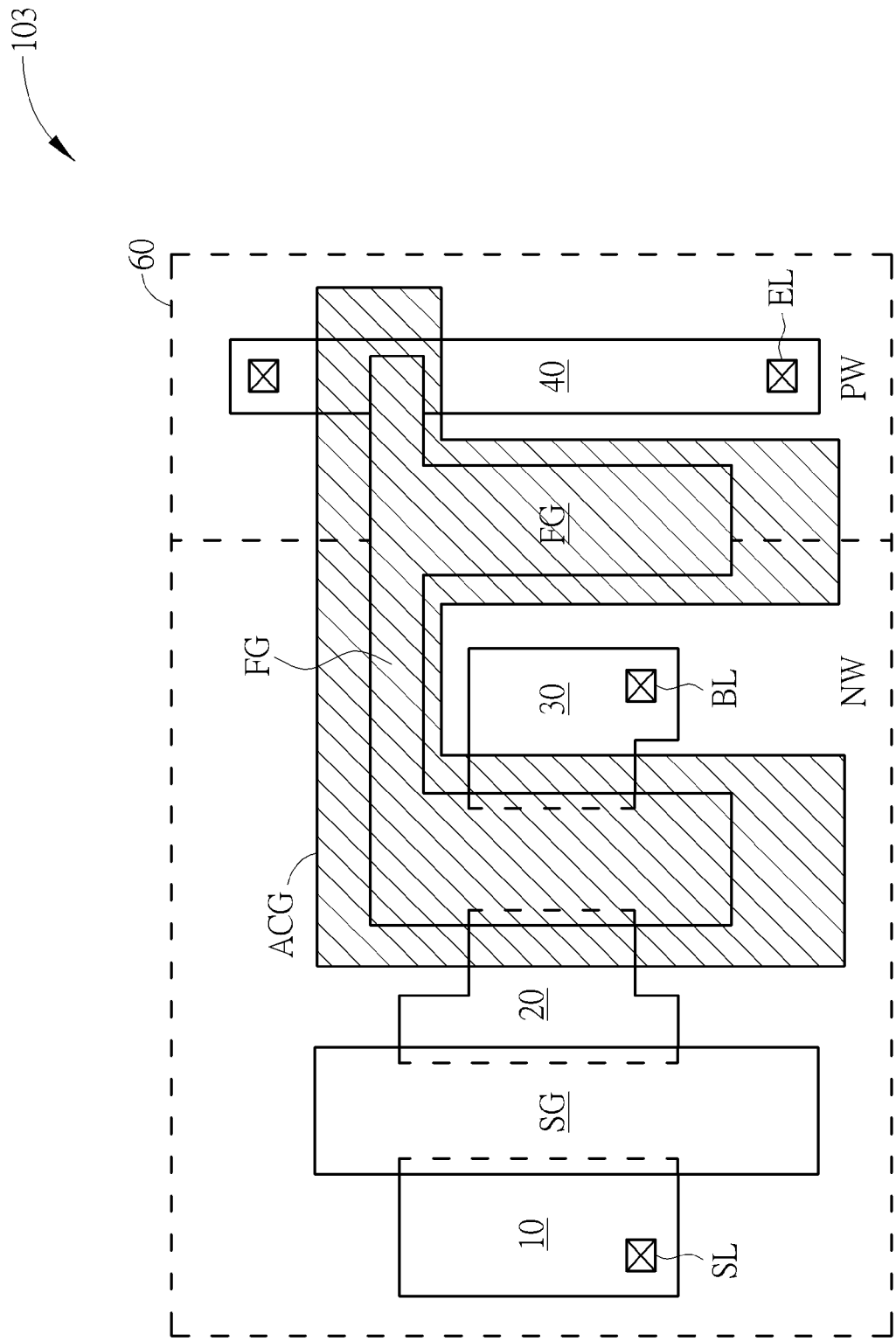
FIG. 3 is a diagram illustrating the top-view of a non-volatile memory cell according to another embodiment of the present invention.

FIGS. 1~3 are diagrams illustrating the top-view of non-volatile memory cells 101~103 according to embodiments of the present invention. Each of the non-volatile memory cells 101~103 may be formed on a substrate 60 which has four implanted diffusion regions. A select gate SG is formed above a first diffusion region 10 and a second diffusion region 20. A floating gate FG is formed above the second diffusion region 20, a third diffusion region and a fourth diffusion region 40. An assistant control gate ACG is formed above the floating gate FG, wherein the area of the assistant control gate ACG overlaps with at least 50% area of the floating gate FG.

In the present invention, the floating gate FG and the select gate SG may be formed in the single polysilicon layer provided in CMOS manufacturing processes. In an embodiment, the assistant control gate ACG may be formed in the M1 layer provided in CMOS manufacturing processes. In another embodiment, the assistant control gate ACG may be formed in the M2 layer or any conductive routing metal provided in CMOS manufacturing processes.

In the present invention, the overlapping region of the floating gate FG and the fourth diffusion region 40 forms an erase gate region EG which provides a coupling node at the floating gate FG. Also, the area of the assistant control gate ACG overlaps with at least 50% area of the floating gate FG in order to provide an additional coupling node at the floating gate FG. In the embodiment illustrated in FIG. 1, the area of the metal-layer assistant control gate ACG covers about 80% area of the poly-layer floating gate FG. In the embodiment illustrated in FIGS. 2~3, the area of the metal-layer assistant control gate ACG covers 100% area of the poly-layer floating gate FG.

In the present invention, the doping type of the diffusion regions 10, 20, 30, 40 may be determined by the type of the non-volatile memory cells 101~103. In the embodiments illustrated in FIGS. 1~3, the non-volatile memory cells 101~103 are implemented as CMOS memory cell in which the diffusion regions 10, 20 and 30 are P-type doping regions in an N-type well (NW) of the substrate 60 whereas the diffusion region 40 is an N-type doping region in a P-type well (PW) of the substrate 60. However, the doping type of the diffusion regions does not limit the scope of the present invention.

Figure 4:
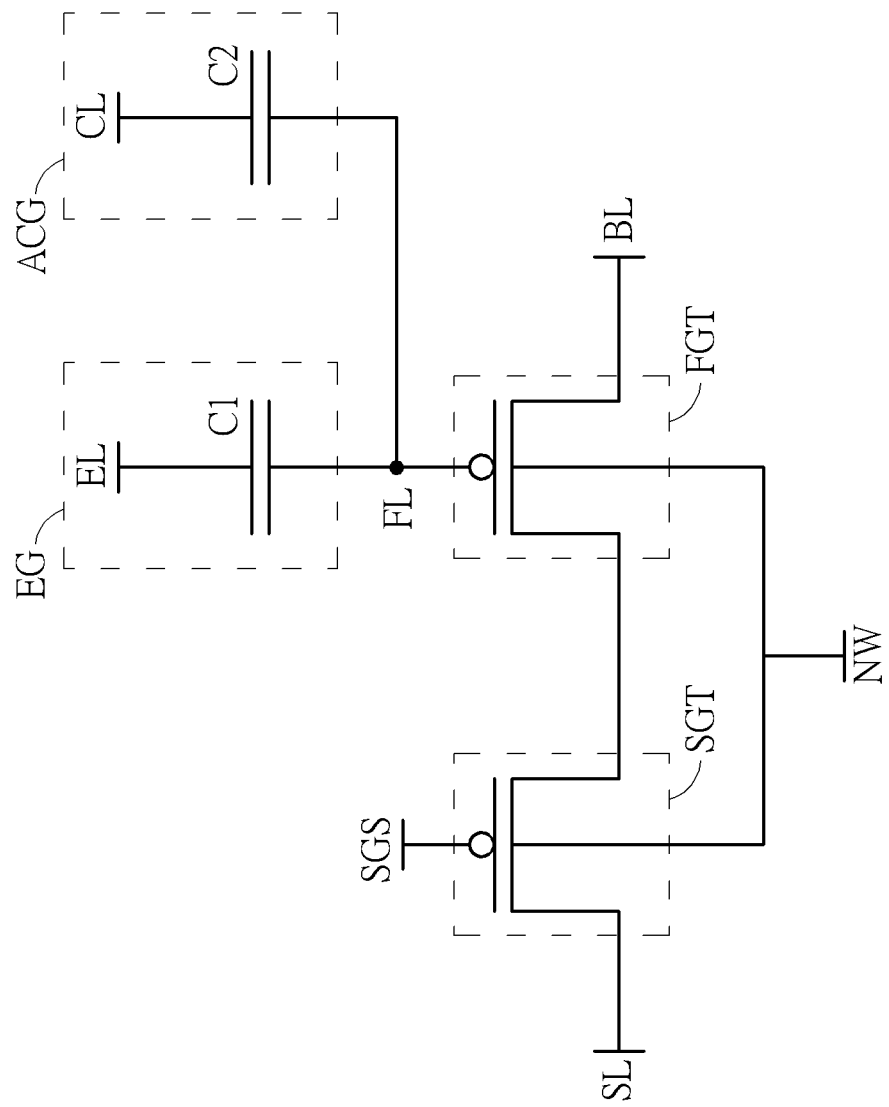
FIG. 4 is a diagram illustrating an equivalent circuit of a non-volatile memory cell according to an embodiment of the present invention.

FIG. 4 is a diagram illustrating an equivalent circuit of the non-volatile memory cells 101~103 according to an embodiment of the present invention. A select gate transistor SGT may be formed by the first diffusion region 10 and the second diffusion region 20 separated by a channel (not illustrated) that may be induced under the select gate SG which serves as the control terminal of the select gate transistor SGT. A floating gate transistor FGT may be formed by the second diffusion region 20 and the third diffusion region 30 separated by a channel (not illustrated) that may be induced under the floating gate FG which serves as the control terminal of the select gate transistor SGT. Depending upon whether the select gate transistor SGT or the floating gate transistor FGT is an NMOS or PMOS transistor, a corresponding diffusion region either serves as a drain terminal or a source terminal of the select gate transistor SGT or the floating gate transistor FGT.

The first diffusion region 10 is coupled to a source line. The third diffusion region 30 is coupled to a bit line. The select gate SG is coupled to a word line. The fourth diffusion region 40 is coupled to an erase line. The capacitance induced by the erase gate region EG is represented by a capacitor C1. The capacitance induced by the assistant control gate ACG is represented by a capacitor C2.

In an embodiment, the assistant control gate ACG may be preferably coupled to the source line, or coupled to any of the bit line, the word line, or the NW of the substrate 60. In another embodiment, the assistant control gate ACG may be coupled to any signal line whose level is equal to the bias level of any of the bit line, the word line, the source line, or the NW of the substrate 60 during the same operational mode. FIG. 4 depicts the embodiment in which the assistant control gate ACG is coupled to a signal line CL, but does not limit the scope of the present invention.

The select gate transistor SGT includes a first terminal, a second terminal coupled to the source line for receiving a source line signal SL, and a control terminal coupled to the word line for receive a select gate signal SGS. The floating gate transistor FGT includes a first terminal coupled to the bit line for receiving a bit line signal BL, a second terminal coupled to the first terminal of the select gate transistor SGT, and a floating gate (without any bias applied).

In the present invention, the non-volatile memory cells 101~103 may be programmed or erased by one of two mechanisms: hot electron injection and Fowler-Nordheim tunneling. In hot electron injection, a high voltage applied to the drain accelerates electrons across the substrate channel region. At the same time a high voltage coupled to the floating gate pulls the hot electrons through a thin gate dielectric onto the floating gate. In Fowler-Nordheim tunneling, a high enough voltage is placed between the floating gate and the channel's source and drain to force a current to flow from the channel through the floating gate. This current either brings electrons from the channel onto the floating gate to program the cell, or if it's reversed it drags electrons out of the floating gate back to the channel to achieve an erase.

For illustrative purposes, it is assumed that the diffusion regions 10, 20 and 30 are P-type doping regions in the NW of the substrate 60, the diffusion region 40 is an N-type doping region in the PW of the substrate 60, the non-volatile memory cells 101~103 are programmed by hot electron injection mechanism and erased by Fowler-Nordheim tunneling mechanism. The following Table 1 illustrates the operation of the non-volatile memory cells 101~103 during a program mode, an erase mode, a negative erase mode and a read mode.

TABLE 1

| Mode | SL | SGS | BL | NW | EL | PW | ACG |
|---|---|---|---|---|---|---|---|
| Program | VPP | 0~VDD | 0 | VPP | 0~VPP | 0 | 0~VPP |
| Erase | 0 | 0 | 0 | 0 | 0~VEE | 0 | 0~-VEE |
| Negative Erase | VBB | 0~-VEE | VBB | 0 | 0~VEE | 0 | 0~-VEE |
| Read | $V_{READ}$ | 0 | 0 | $V_{READ}$ | 0 | 0 | 0~$V_{READ}$ |

When the non-volatile memory cells 101~103 operate in the program mode, the bit line signal BL is biased at 0, the source line signal SL is biased at VPP, the select gate signal SGS is biased at 0~VDD, the NW of the substrate 60 is biased at VPP, and the PW of the substrate 60 is biased at 0, wherein 0<VDD<VPP. The erase line EL and the assistant control gate ACG are biased at 0~VPP, thereby charging the floating gate FG with channel hot electrons. In a preferred embodiment, the erase line EL is biased at a first voltage between 0 and VPP and the assistant control gate ACG is biased at a second voltage between 0 and VPP, wherein the second voltage is larger than the first voltage. In addition to the erase gate region EG (capacitor C1), the assistant control gate ACG further provides an additional capacitor C2 which accelerate the process of pulling the hot electrons onto the floating gate FG. Therefore, the present invention can improve the program efficiency of the non-volatile memory cells 101~103.

When the non-volatile memory cells 101~103 operate in the erase mode, the source line signal SL, the select gate signal SGS, the bit line signal BL, the NW of the substrate 60, and the PW of the substrate 60 are biased at 0. The erase line EL is biased at 0~VEE and the assistant control gate ACG is biased at 0~VEE, wherein VEE>0. This way, the electrons stored in the floating gate FG may be dragged out to achieve an erase. In addition to the erase gate region EG, the assistant control gate ACG further provides an additional coupling node which accelerate the process of pulling the hot electrons out of the floating gate FG. Therefore, the present invention can improve the erase efficiency of the non-volatile memory cells 101~103.

When the non-volatile memory cells 101~103 operate in the negative erase mode, the source line signal SL and the bit line signal BL are biased at VBB. The select gate signal SGS is biased at 0~VEE. The NW of the substrate 60 and the PW of the substrate 60 are biased at 0. The erase line EL is biased at 0~VEE and the assistant control gate ACG is biased at 0~VEE, wherein −VEE<VBB<0. With the negatively biased source line signal SL, the select gate signal SGS, and the bit line signal BL, the electrons stored in the floating gate FG may be dragged out to achieve an erase faster in the negative erase mode than in the erase mode. In addition to the erase gate region EG, the assistant control gate ACG further provides an additional coupling node which further accelerates the process of pulling the hot electrons out of the floating gate FG. Therefore, the present invention can improve the erase efficiency of the non-volatile memory cells 101~103.

When the non-volatile memory cells 101~103 operate in the read mode, the source line signal SL, the NW of the substrate 60 and the assistant control gate ACG are biased at $V_{READ}$, wherein $V_{READ}$<VDD. The select gate signal SGS, the bit line signal BL, the erase line EL, and the PW of the substrate 60 are biased at 0V.

In the present invention, the effective capacitance C2 provided by the assistant control gate ACG is determined by the area of the floating gate FG, as well as by the overlapping ration of the floating gate FG and the assistant control gate ACG. For example, for the floating gate FG of the same size as depicted in FIGS. 1 and 2, the assistant control gate ACG with 100% overlapping ratio in FIG. 2 results in a larger C2 than the assistant control gate ACG with 80% overlapping ratio in FIG. 1. For the same 100% overlapping ratio as depicted in FIGS. 2 and 3, the floating gate FG with a larger size in FIG. 3 results in a larger C2 than the floating gate FG with a smaller size in FIG. 2. However, the shapes of the floating gate FG and the assistant control gate ACG do not limit the scope of the present invention.

In the present invention, a metal-layer assistant control gate is formed above the poly-layer floating gate with an overlapping area larger than 50% of the entire floating gate area. This way, the metal-to-poly capacitance induced between the assistant control gate and the floating gate can provide an additional coupling node to the floating gate, thereby improving the program/erase efficiency of the non-volatile memory cell.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory cell, comprising
   a substrate including a first diffusion region, a second diffusion region, a third diffusion region, and a fourth diffusion region;
   a select gate formed above the first diffusion region and the second diffusion region in a polysilicon layer;
   a floating gate formed above the second diffusion region, the third diffusion region and the fourth diffusion region in the polysilicon layer; and
   an assistant control gate formed above the floating gate in a metal layer, wherein an area of the assistant control gate overlaps with at least half an area of the floating gate.

2. The non-volatile memory cell in claim 1, wherein an overlapping region of the floating gate and the fourth diffusion region forms an erase gate region which provides a coupling node at the floating gate.

3. The non-volatile memory cell in claim 1, wherein the metal layer is an M1 metal layer provided in a complementary metal-oxide-semiconductor (CMOS) manufacturing process.

4. The non-volatile memory cell in claim 1, wherein the metal layer is an M2 metal layer or any conductive routing metal provided in a CMOS manufacturing process.

5. The non-volatile memory cell in claim 1, wherein the floating gate and the select gate are formed in a polysilicon layer provided in a CMOS manufacturing process.

6. The non-volatile memory cell in claim 1, wherein:
   the first diffusion region, the second diffusion region, and the third diffusion region have a first doping type; and
   the fourth diffusion region has a second doping type which is complementary to the first doping type.

7. The non-volatile memory cell in claim 1, wherein:
   the first diffusion region is coupled to a source line;
   the third diffusion region is coupled to a bit line;
   the select gate is coupled to a word line; and
   the assistant control gate is coupled to the source line.

8. The non-volatile memory cell in claim 1, wherein:
   the first diffusion region is coupled to a source line;
   the third diffusion region is coupled to a bit line;
   the select gate is coupled to a word line; and
   the assistant control gate is coupled to one of the bit line, the word line, and an N-type well of the substrate.

9. The non-volatile memory cell in claim 1, wherein:
   the first diffusion region is coupled to a source line;
   the third diffusion region is coupled to a bit line;
   the select gate is coupled to a word line; and
   the assistant control gate is coupled to a signal line whose level is equal to a bias level of the bit line, the word line, the source line or an N-type well of the substrate in a same mode of operation.

10. A method of operating a non-volatile memory cell which includes:
    a substrate including a first diffusion region, a second diffusion region, a third diffusion region, and a fourth diffusion region;
    a select gate formed above the first diffusion region and the second diffusion region in a polysilicon layer;
    a floating gate formed above the second diffusion region, the third diffusion region and the fourth diffusion region in the polysilicon layer; and
    an assistant control gate formed above the floating gate in a metal layer, wherein an area of the assistant control gate overlaps with at least half an area of the floating gate;
    the method comprising:
    applying a first voltage to the fourth diffusion region and applying a second voltage to the assistant control gate so as to bring electrons onto the floating gate during a program mode of operation;

applying a third voltage to the fourth diffusion region and applying a fourth voltage to the assistant control gate as to drag electrons out of the floating gate during an erase mode of operation;

wherein:

the first voltage and the second voltage are between 0 and a first positive value;

the third voltage is between 0 and a second positive value; and the fourth voltage is between 0 and a first negative value.

11. The method of claim 10, further comprising:

applying a fifth voltage to the first diffusion region, applying a sixth voltage to the third diffusion region and applying a seventh voltage to the select gate during the program mode of operation;

wherein:

the fifth voltage is equal to the first positive value;

the sixth voltage is equal to 0; and the seventh voltage is between 0 and a third positive value which is smaller than the first positive value.

12. The method of claim 10, further comprising:

applying an eighth voltage to the first diffusion region, the select gate, and the third diffusion region during the erase mode of operation, wherein the eighth voltage is equal to 0.

13. The method of claim 10, further comprising:

applying an eighth voltage to the first diffusion region, and the third diffusion region and applying an ninth voltage to the select gate during the erase mode of operation;

wherein the eight voltage is equal to a second negative value while the ninth voltage is between 0 and the first negative value.

14. The method of claim 10, wherein the second voltage is larger than the first voltage.

* * * * *